United States Patent
Nagatomo

(10) Patent No.: US 11,824,519 B2
(45) Date of Patent: Nov. 21, 2023

(54) ACOUSTIC WAVE DEVICE

(71) Applicant: Murata Manufacturing Co., Ltd., Nagaokakyo (JP)

(72) Inventor: Shou Nagatomo, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 408 days.

(21) Appl. No.: 17/195,702

(22) Filed: Mar. 9, 2021

(65) Prior Publication Data

US 2021/0194457 A1 Jun. 24, 2021

Related U.S. Application Data

(63) Continuation of application No. PCT/JP2019/036624, filed on Sep. 18, 2019.

(30) Foreign Application Priority Data

Sep. 20, 2018 (JP) ................................ 2018-176085

(51) Int. Cl.
*H03H 9/02* (2006.01)
*H03H 9/145* (2006.01)
*H03H 9/25* (2006.01)

(52) U.S. Cl.
CPC .... *H03H 9/14541* (2013.01); *H03H 9/02559* (2013.01); *H03H 9/02574* (2013.01); *H03H 9/25* (2013.01)

(58) Field of Classification Search
CPC ........... H03H 9/14541; H03H 9/02559; H03H 9/02574

USPC ...... 310/313 R, 313 A, 313 B, 313 C, 313 D
See application file for complete search history.

(56) References Cited

U.S. PATENT DOCUMENTS

| | | | |
|---|---|---|---|
| 2007/0096592 A1* | 5/2007 | Kadota | H03H 9/02559 310/313 A |
| 2008/0169474 A1* | 7/2008 | Sheppard | H03H 3/08 257/E27.014 |
| 2012/0074809 A1* | 3/2012 | Nishiyama | G01N 29/348 310/313 A |
| 2013/0285768 A1 | 10/2013 | Watanabe et al. | |
| 2014/0152146 A1* | 6/2014 | Kimura | H03H 9/02535 29/25.35 |

(Continued)

FOREIGN PATENT DOCUMENTS

| | | |
|---|---|---|
| JP | 2010-068109 A | 3/2010 |
| JP | 2011-514689 A | 5/2011 |

(Continued)

OTHER PUBLICATIONS

First Office Action in KR1020217004632, dated Mar. 30, 2023, 5 pages.

(Continued)

*Primary Examiner* — Derek J Rosenau
(74) *Attorney, Agent, or Firm* — KEATING & BENNETT, LLP

(57) ABSTRACT

An acoustic wave device uses a longitudinal acoustic wave, and includes a piezoelectric layer including first and second principal surfaces opposite to each other, an IDT electrode directly or indirectly on the first principal surface, and a high acoustic velocity member directly or indirectly on the second principal surface and including a 4H-type or 6H-type crystal polytype silicon carbide.

19 Claims, 15 Drawing Sheets

(56) References Cited

U.S. PATENT DOCUMENTS

| | | | |
|---|---|---|---|
| 2016/0182009 A1* | 6/2016 | Bhattacharjee | .... H03H 9/02275 |
| | | | 310/313 R |
| 2018/0048282 A1 | 2/2018 | Kurimoto et al. | |
| 2018/0097508 A1 | 4/2018 | Iwamoto et al. | |
| 2018/0294793 A1 | 10/2018 | Tanno et al. | |

FOREIGN PATENT DOCUMENTS

| | | |
|---|---|---|
| JP | 2018-026695 A | 2/2018 |
| KR | 1020170134623 A | 12/2017 |
| WO | 2012/086639 A1 | 6/2012 |
| WO | 2017/051747 A1 | 3/2017 |

OTHER PUBLICATIONS

Official Communication issued in International Patent Application No. PCT/JP2019/036624, dated Oct. 29, 2019.

\* cited by examiner cFACE=Euler Angle$(0,0,\psi)$ cFACE=Euler Angle(0,0,$\psi$)

a FACE=Euler Angle(90,90,$\psi$)

a FACE=Euler Angle(90,90,ψ)

m FACE=Euler Angle(0,90,$\psi$)

mFACE=Euler Angle(0,90,$\psi$)

rFACE=Euler Angle(0,122.23,$\psi$)

rFACE=Euler Angle(0,122.23,$\psi$)

ACOUSTIC WAVE DEVICE

CROSS REFERENCE TO RELATED APPLICATIONS

This application claims the benefit of priority to Japanese Patent Application No. 2018-176085 filed on Sep. 20, 2018 and is a Continuation Application of PCT Application No. PCT/JP2019/036624 filed on Sep. 18, 2019. The entire contents of each application are hereby incorporated herein by reference.

BACKGROUND OF THE INVENTION

1. Field of the Invention

The present invention relates to an acoustic wave device including an interdigital transducer (IDT) electrode.

2. Description of the Related Art

At a high-frequency front-end unit of a mobile communication device, a surface acoustic wave filter having features of a small size, low loss, and high selectivity is used. A surface acoustic wave element defining the surface acoustic wave filter has a structure in which an IDT electrode is formed on a surface of a piezoelectric layer, and interconversion is performed between an electrical signal and an acoustic wave signal. In the surface acoustic wave element, various excitation modes are used as surface acoustic waves.

In International Publication No. 2012/086639, a range of Euler angles of the piezoelectric layer in which excitation of an SH wave vibrating in a horizontal plane is more dominant than an SV wave vibrating in a vertical plane is defined, with respect to the surface of the piezoelectric layer. According to this, with the electromechanical coupling coefficient of the SH wave increased and the electromechanical coupling coefficient of the SV wave decreased, a wide-band acoustic wave filter with favorable attenuation characteristics can be configured, in which the SH wave is taken as a principal mode and SV-wave spurious is excluded.

As mobile communication systems advance from 3G and 4G to 5G, the frequency band that is used is made higher to a band equal to or higher than 3 GHz. To make the frequency of the acoustic wave element higher, possible solutions are (1) to decrease an IDT wavelength defined by the pitch of the IDT electrode and (2) to make the acoustic velocity faster. When the IDT wavelength is decreased, problems occur, such as limitation of processing accuracy of the IDT electrode and high resistance of the IDT electrode. Thus, to increase the frequency of the acoustic wave element, it is important to increase the acoustic velocity.

In the substrate including the piezoelectric layer, volume waves (bulk waves) of three types are present, that is, a "slow transversal wave", a "fast transversal wave", and a "longitudinal wave". The phase velocity of the leaky surface acoustic wave (LSAW) where the components of the transversal wave are dominant is positioned between the "slow transversal wave" and the "fast transversal wave". In International Publication No. 2012/086639, by trapping the leaky surface acoustic wave (LSAW) in the high acoustic velocity layer, a wide-band acoustic wave filter with favorable attenuation characteristics is achieved. In contrast, the phase velocity of the longitudinal leaky surface acoustic wave (LLSAW) is fast, positioned between the "fast transversal wave" and the "longitudinal wave". Thus, to increase the frequency of the acoustic wave element, a possible solution is to use the longitudinal leaky surface acoustic wave (LLSAW).

However, the longitudinal leaky surface acoustic wave (LLSAW) is in a mode in which the surface acoustic waves propagate as being leaked to the substrate including the piezoelectric layer. Thus, a problem of Q-factor deterioration occurs.

SUMMARY OF THE INVENTION

Preferred embodiments of the present invention provide acoustic wave devices each having an excellent Q factor by using a longitudinal acoustic wave, that is, by efficiently trapping a longitudinal leaky surface acoustic wave (LLSAW) in the piezoelectric layer and the IDT electrode.

An acoustic wave device according to a preferred embodiment of the present invention uses a longitudinal acoustic wave, and the acoustic wave device includes a piezoelectric layer including a first principal surface and a second principal surface opposite to each other, an IDT electrode provided directly or indirectly on the first principal surface, and a high acoustic velocity member provided directly or indirectly on the second principal surface and including a 4H-type or 6H-type crystal polytype silicon carbide.

According to preferred embodiments of the present invention, acoustic wave devices using the longitudinal leaky surface acoustic wave (LLSAW) and having an excellent Q factor are able to be provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
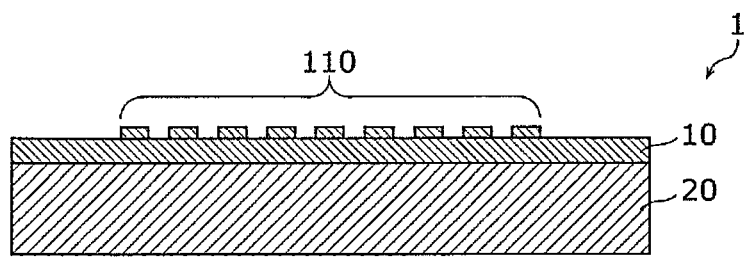
FIG. 1 is a sectional view of an acoustic wave device according to a preferred embodiment of the present invention.

In the following, preferred embodiments of the present invention are described in detail with reference to preferred embodiments and the drawings. Note that any of the preferred embodiments described below represents a generic or specific example. Numerical values, shapes, materials, components, arrangement and connection configurations of the components, and the like which are described in the preferred embodiments below are merely examples, and are not intended to restrict the present invention. Of the components of the preferred embodiments below, those not described in an independent claim are described as arbitrary or optional components. Also, the size of the components shown in the drawings or a ratio in size thereof is presented not necessarily in a strict sense.

PREFERRED EMBODIMENT 1-1. Structure of Acoustic Wave Device

FIG. 1 is a sectional view of an acoustic wave device 1 according to a preferred embodiment of the present invention. As shown in FIG. 1, the acoustic wave device 1 includes a piezoelectric layer 10, an interdigital transducer (IDT) electrode 110, and a high acoustic velocity member 20.

The piezoelectric layer 10 is a thin film or thin plate which includes a first principal surface and a second principal surface opposite to each other and is made of a piezoelectric material. As the material of the piezoelectric layer 10, for example, any of $LiNbO_3$, $LiTaO_3$, ZnO, AlN, quartz, and so forth is preferably selected as appropriate in consideration of a resonance Q factor, an electromechanical coupling coefficient, and other characteristics of the acoustic wave device 1.

The IDT electrode 110 is provided on the first principal surface of the piezoelectric layer 10, and is preferably made of, for example, a metal selected from Al, Cu, Pt, Au, Ti, Ni, Cr, Ag, W, Mo, Ta, and so forth or an alloy or a multilayer body made of two or more metals thereof. The IDT electrode 110 includes a pair of comb-shaped electrodes opposite to each other when the piezoelectric layer 10 is viewed in plan. Each of the paired comb-shaped electrodes includes a plurality of electrode fingers parallel or substantially parallel to each other and a busbar electrode connecting the plurality of electrode fingers. The plurality of electrode fingers included in one comb-shaped electrode and the plurality of electrode fingers included in the other comb-shaped electrode are interdigitated with one another along a direction orthogonal or substantially orthogonal to a principal-mode acoustic wave propagation direction. Here, a pitch between a plurality of electrode fingers included in one comb-shaped electrode is defined as an IDT wavelength λ. In other words, a doubling of the pitch between adjacent electrode fingers of the plurality of electrode fingers of the paired comb-shaped electrodes is defined as an IDT wavelength. Note that in the piezoelectric layer 10 viewed in plan, a reflector may be provided adjacent to the IDT electrode 110 in the principal-mode acoustic wave propagation direction.

The high acoustic velocity member 20 is a support substrate provided on the second principal surface of the piezoelectric layer 10 and is preferably made of a 4H-type or 6H-type crystal polytype silicon carbide, for example.

The acoustic wave device 1 having the above-described structure is an acoustic wave device using a longitudinal acoustic wave, and is, for example, an acoustic wave device capable of exciting, among leaky surface acoustic waves (LSAW), a longitudinal leaky SAW (LLSAW) where longitudinal wave components are more dominant than transversal wave components. In other words, the acoustic wave device 1 is an acoustic wave device capable of using the longitudinal leaky SAW (LLSAW) as a principal-mode acoustic wave.

As mobile communication systems advance from 3G and 4G to 5G, the frequency band used is made higher to a band equal to or higher than 3 GHz. To make the frequency of the acoustic wave device higher, possible solutions are (1) to decrease an IDT wavelength defined by the pitch of the IDT electrode and (2) to make the acoustic velocity faster. When the IDT wavelength is decreased, problems occur such as limitation of processing accuracy of the IDT electrode and high resistance of the IDT electrode. Thus, to increase the frequency of the acoustic wave device, it is important to increase the acoustic velocity.

In the substrate including the piezoelectric layer, volume waves (bulk waves) of three types are present, that is, a "slow transversal wave", a "fast transversal wave", and a "longitudinal wave". The phase velocity of the leaky surface acoustic wave (LSAW) where the components of the transversal wave are dominant is positioned between the "slow transversal wave" and the "fast transversal wave". In contrast, the phase velocity of the longitudinal leaky SAW (LLSAW) is fast, positioned between the "fast transversal wave" and the "longitudinal wave". Thus, to increase the frequency of the acoustic wave device, a possible solution is to use the longitudinal leaky SAW (LLSAW).

On the other hand, in an acoustic resonator having a multilayer structure including a piezoelectric layer and a support substrate, when the bulk wave acoustic velocity of the support substrate is higher than that of the piezoelectric layer, a mode excited by the IDT electrode is not coupled to the bulk wave of the support substrate and acoustic energy in that mode is distributed to be concentrated onto the piezoelectric layer and the IDT electrode. Here, the longitudinal leaky SAW (LLSAW) is no longer leaked, and becomes a guided longitudinal acoustic wave.

As described above, the longitudinal leaky SAW (LLSAW) has a very high acoustic velocity compared with the leaky surface acoustic wave (LSAW), and is easily coupled to the transversal wave (for example, SV bulk wave and SH bulk wave) of the piezoelectric layer. To efficiently trap the longitudinal leaky SAW (LLSAW) in the piezoelectric layer and the IDT electrode, the high acoustic velocity member preferably has a transversal bulk wave acoustic velocity faster than the acoustic velocity of the longitudinal leaky SAW (LLSAW).

However, generally, the longitudinal leaky SAW (LLSAW) has an acoustic velocity (for example, about 6000 m/s or higher) higher than acoustic velocity of the transversal bulk wave of the high acoustic velocity member, such as, for example, silicon for use in a multilayer structure including a thin piezoelectric layer and a high acoustic velocity support substrate. Thus, it is difficult to trap the longitudinal leaky SAW (LLSAW) in the piezoelectric layer and to ensure a sufficient Q factor.

By contrast, according to the above-described structure of the present preferred embodiment, the high acoustic velocity member 20 defining a support substrate is preferably made of a 4H-type or 6H-type crystal polytype silicon carbide, for example. Thus, the transversal bulk wave acoustic velocity of the high acoustic velocity member 20 can be made faster than the acoustic velocity of the longitudinal leaky SAW (LLSAW) propagating through the piezoelectric layer 10. Therefore, the longitudinal leaky SAW (LLSAW) can be efficiently trapped in the piezoelectric layer 10 and the IDT electrode 110, thus allowing the Q factor of the resonance characteristics of the acoustic wave device 1 to be improved. Accordingly, by using the longitudinal acoustic wave, the acoustic wave device 1 with an excellent Q factor can be provided.

Silicon carbide is one of materials with the smallest viscosity losses and also has large thermal conductivity. Therefore, favorable electrical characteristics and power durability characteristics can be provided. Some of silicon carbide are crystal polytype, called a 3C-type, 4H-type, and 6H-type. Of these, the 3C-type has a slow bulk wave acoustic velocity, and when used as the high acoustic velocity member in contact with the piezoelectric layer, is not sufficient to trap the longitudinal leaky SAW (LLSAW). On the other hand, in the 4H-type and the 6H-type, the slowest transversal bulk wave acoustic velocity is approximately 6000 m/s to 7000 m/s, for example.

Figure 2A:
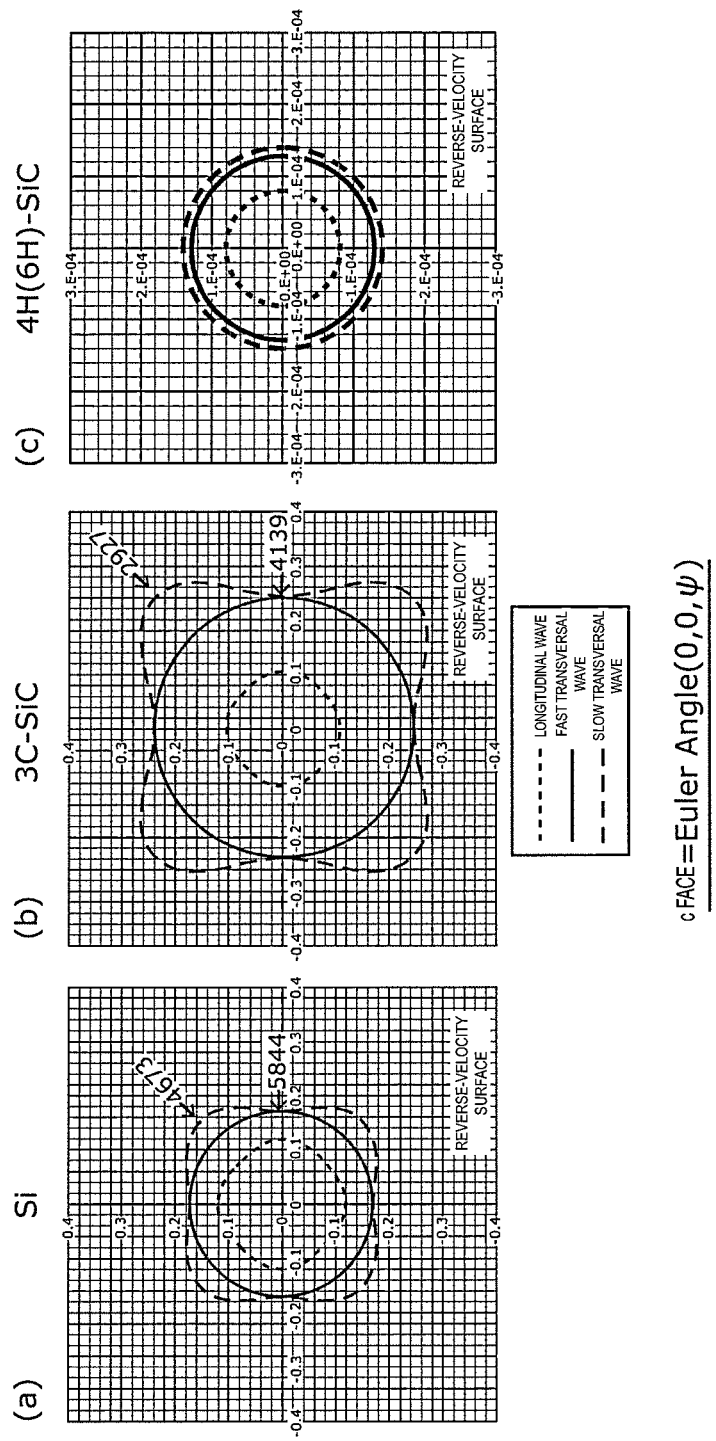
FIG. 2A depicts graphs depicting reverse-velocity surfaces of Si, 3C—SiC, and 4H(6H)—SiC.

FIG. 2A shows graphs depicting reverse-velocity surfaces of a c face (Euler angle notation (0, 0, ψ)) of Si, 3C—SiC, and 4H(6H)—SiC. As shown in FIG. 2A, when applied to the high acoustic velocity member with the c face as a principal surface, Si and 3C-type silicon carbide has an acoustic velocity equal to or lower than approximately 6000 m/s. By contrast, the 4H-type or 6H-type crystal polytype silicon carbide has an acoustic velocity of approximately 6000 m/s to 7000 m/s, for example. With this, it has been discovered that when the 4H-type or 6H-type crystal polytype silicon carbide is used as the high acoustic velocity member 20, it is advantageous to efficiently trap the longitudinal leaky SAW (LLSAW) in the piezoelectric layer 10 and the IDT electrode 110.

Below are preferable crystal orientations when a 4H-type/6H-type crystal polytype silicon carbide is used as the high acoustic velocity member 20. Note in the following that Euler angle notation is used to describe crystal orientations.

Figure 2B:
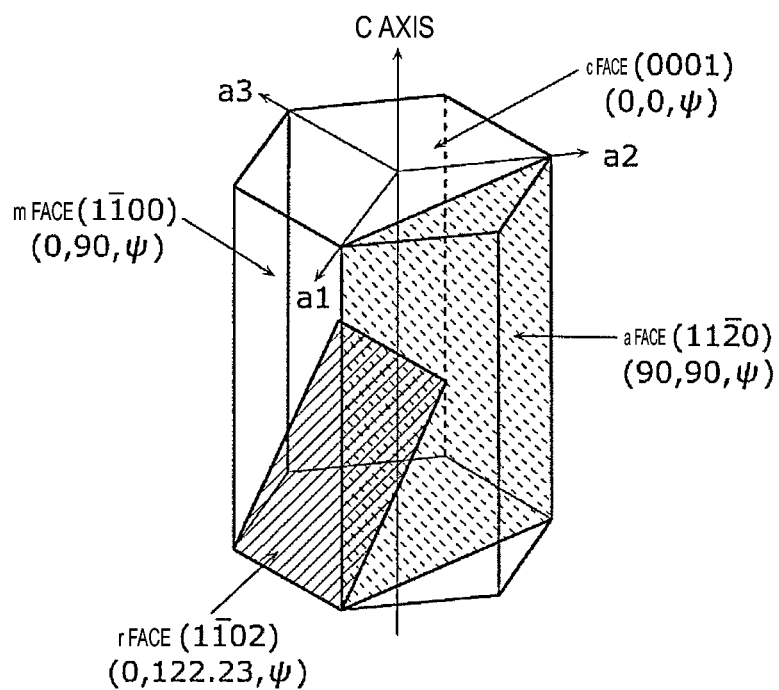
FIG. 2B is a diagram describing crystal face orientations in a hexagonal crystal.

FIG. 2B is a diagram describing crystal face orientations in a hexagonal crystal. As shown in FIG. 2B, in the present preferred embodiment, a c-face orientation is denoted as Euler angles (0, 0, ψ), an a-face orientation is denoted as Euler angles (90, 90, ψ), an m-face orientation is denoted as Euler angles (0, 90, ψ), and an r-face orientation is denoted as Euler angles (0, 122.23, ψ). Here, ψ is defined as follows. As for the c face, ψ denotes an angle defined by an electrode-finger orthogonal direction when viewed from above on a principal surface side where the IDT electrode is provided and the Miller indices of silicon carbide, crystal orientation [1000]. Furthermore, as for the a face, ψ denotes an angle defined by the electrode-finger orthogonal direction when viewed from above on the principal surface side where the IDT electrode is provided and the Miller indices of silicon carbide, crystal orientation [0001]. Still further, as for the r surface, ψ denotes an angle defined by the electrode-finger orthogonal direction when viewed from above on the principal surface side where the IDT electrode is defined and the Miller indices of silicon carbide, crystal orientation [1-10-1].

Note that in the acoustic wave device 1 according to the present preferred embodiment, the piezoelectric layer 10 may preferably have, for example, a film thickness equal to or smaller than about three times of an IDT wavelength defined by a doubling of a pitch between the plurality of electrode fingers configuring the IDT electrode 110. This allows the longitudinal leaky SAW (LLSAW) to be efficiently trapped in the piezoelectric layer 10 and the IDT electrode 110. Thus, the Q factor of the resonance characteristics of the acoustic wave device 1 can be further improved.

Furthermore, in the acoustic wave device 1 according to the present preferred embodiment, the film thickness of the piezoelectric layer 10 is preferably, for example, equal to or larger than about 0.05 times of the IDT wavelength and equal to or smaller than about 0.5 times thereof. This can improve both of the electromechanical coupling coefficient and the Q factor of the resonance characteristics of the acoustic wave device 1.

Also, the piezoelectric layer 10 may preferably be made of lithium tantalate, for example. This can provide the acoustic wave device 1 with excellent temperature stability.

Also, the piezoelectric layer 10 may preferably be made of lithium niobate, for example. This can provide the acoustic wave device 1 with an excellent electromechanical coupling coefficient.

Also, when Euler angles of the piezoelectric layer 10 are denoted as (φ, θ, ψ), $-5° \leq φ \leq 5°$ and $0° \leq θ \leq 90°$ and $85° \leq ψ \leq 95°$ may preferably be maintained. For example, the piezoelectric layer 10 is preferably made of YZ—LiNbO$_3$ (0°, 90°, 90°). This allows the use of a longitudinal leaky SAW (LLSAW) mode with high acoustic velocity and less spurious responses.

Furthermore, when Euler angles of the piezoelectric layer 10 are denoted as (φ, θ, ψ), $15° \leq φ \leq 95°$ and $85° \leq θ \leq 95°$ and $0° \leq ψ \leq 60°$ may preferably be maintained. For example, the piezoelectric layer 10 is preferably made of LiNbO$_3$ (90°, 90°, 36°) or LiTaO$_3$ (90°, 90°, 31°). This allows the use of a longitudinal leaky SAW (LLSAW) mode with high acoustic velocity and in a wide band.

Still further, when Euler angles of the piezoelectric layer 10 are denoted as $(\varphi, \theta, \psi)$, $-5°\leq\varphi\leq5°$ and $120°\leq\theta\leq160°$ and $-5°\leq\psi\leq5°$ may preferably be maintained. For example, the piezoelectric layer 10 is preferably made of 41°-LiNbO$_3$ (0°, -49°, 0°) or 36° YX—LiTaO$_3$ (0°, -54°, 0°). This allows the use of a longitudinal leaky SAW (LLSAW) mode with a high Q factor.

Figure 3A:
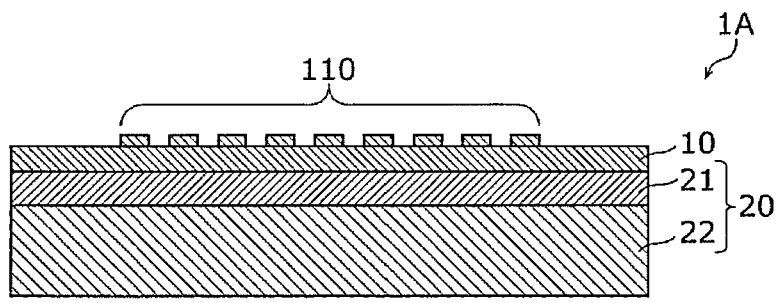
FIG. 3A is a sectional view of an acoustic wave device according to Modified Example 1 of a preferred embodiment of the present invention.

FIG. 3A is a sectional view of an acoustic wave device 1A according to Modified Example 1 of a preferred embodiment of the present invention. As shown in FIG. 3A, the acoustic wave device 1A includes the piezoelectric layer 10, the IDT electrode 110, and a high acoustic velocity member 20. The high acoustic velocity member 20 includes a high acoustic velocity layer 21 and a support substrate 22. The acoustic wave device 1A according to the present modified example is different in the structure of the high acoustic velocity member 20 compared with the acoustic wave device 1 according to the preferred embodiment. In the following, as for the acoustic wave device 1A according to the present modified example, description of structures the same or substantially the same those of the acoustic wave device 1 according to the present preferred embodiment is omitted, and different structures are mainly described.

The support substrate 22 provided on a second principal surface side of the piezoelectric layer 10 across the high acoustic velocity layer 21 and supporting the piezoelectric layer 10 and the high acoustic velocity layer 21. The support substrate 22 is preferably made of, for example, any of silicon, sapphire, and silicon carbide. This can improve crystallinity of the high acoustic velocity layer 21 made of a crystal polytype silicon carbide and provided on the support substrate 22 and can reduce acoustic losses.

The high acoustic velocity layer 21 is a thin film or thin plate between the support substrate 22 and the piezoelectric layer 10 and is preferably made of a 4H-type or 6H-type crystal polytype silicon carbide, for example.

According to the above-described structure of the present modified example, since the high acoustic velocity layer 21 is made of a 4H-type or 6H-type crystal polytype silicon carbide, the acoustic velocity of the transversal bulk wave of the high acoustic velocity layer 21 can be made faster than the acoustic velocity of the transversal bulk wave coupling to the longitudinal leaky SAW (LLSAW) propagating through the piezoelectric layer 10. Thus, the longitudinal leaky SAW (LLSAW) can be efficiently trapped in the piezoelectric layer 10 and the IDT electrode 110, thus allowing an improvement of the Q factor of the resonance characteristics of the acoustic wave device 1A. Thus, by using the longitudinal acoustic wave, the acoustic wave device 1A with an excellent Q factor can be provided. Also, it is sufficient to use a 4H-type or 6H-type crystal polytype silicon carbide, for example, not for the support substrate 22 being a thick plate, but to the high acoustic velocity layer 21 being a thin film or having a thin-plate shape, thus simplifying the process of manufacture.

Figure 3B:
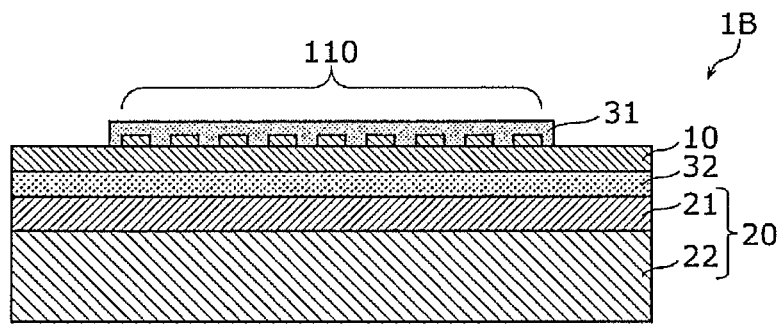
FIG. 3B is a sectional view of an acoustic wave device according to Modified Example 2 of a preferred embodiment of the present invention.

FIG. 3B is a sectional view of an acoustic wave device 1B according to Modified Example 2 of a preferred embodiment of the present invention. As shown in FIG. 3B, the acoustic wave device 1B includes the piezoelectric layer 10, the IDT electrode 110, the high acoustic velocity member 20, a functional layer 31, and an intermediate layer 32. The high acoustic velocity member 20 includes the high acoustic velocity layer 21 and the support substrate 22. The acoustic wave device 1B according to the present modified example is different in that the functional layer 31 and the intermediate layer 32 are added, compared with the acoustic wave device 1A according to Modified Example 1. In the following, as for the acoustic wave device 1B according to the present modified example, description of structures the same or substantially the same those of the acoustic wave device 1A according to Modified Example 1 is omitted, and different structures are mainly described.

The intermediate layer 32 is a low acoustic velocity layer between the piezoelectric layer 10 and the high acoustic velocity layer 21. The acoustic velocity of the slowest transversal bulk wave of the transversal bulk waves propagating through the intermediate layer 32 is slower than the acoustic velocity in the principal mode propagating through the piezoelectric layer 10. With this structure and the property of acoustic waves intrinsically concentrating energy onto a low acoustic velocity medium, leakage of surface acoustic wave energy to the high acoustic velocity member 20 is reduced. Thus, a desired mode can be more efficiently excited. The intermediate layer 32 is a thin film or thin plate made of a dielectric film and preferably including, for example, silicon dioxide as a main component. Furthermore, the intermediate layer 32 may include a dielectric, such as SiN, AlN, Al$_2$O$_3$, Ta$_2$O$_3$, HfO$_2$, or DLC, and may be a semiconductor such as amorphous silicon Ge, GaN, InP, or a compound thereof, for example.

The functional layer 31 is on the first principal surface of the piezoelectric layer 10 and is in contact with at least a portion of the IDT electrode 110. The functional layer 31 may be an adjusting layer between the IDT electrode 110 and the piezoelectric layer 10, or may be a protective layer covering the IDT electrode 110. When the functional layer 31 is an adjusting layer, the electromechanical coupling coefficient can be adjusted in accordance with the film thickness of the adjusting layer. Also, when the functional layer 31 is a protective layer, it is possible to protect the IDT electrode 110 from the external environment, adjust frequency temperature characteristics, and improve moisture resistance. The functional layer 31 is preferably, for example, a dielectric film having silicon dioxide as a main component.

Furthermore, when the functional layer 31 as an adjusting layer includes silicon dioxide as a main component and includes at least one of a carbon atom and a hafnium atom, for example, the electromechanical coupling coefficient (fractional band width) can be adjusted by permittivity modulation. Also, when the functional layer 31 as a protective layer includes silicon dioxide as a main component and includes at least one of a fluorine atom, a boron atom, and a nitrogen atom, for example, the temperature characteristics can be more improved.

Also, with the intermediate layer 32 and the functional layer 31 each defined by a dielectric film, it is possible to provide an acoustic wave device with less influence, such as parasitic capacitance from a metal material or semiconductor material.

Note that in the acoustic wave device 1B according to the present modified example, either of the functional layer 31 and the intermediate layer 32 may be omitted.

1-2. Suitable Conditions of High Acoustic Velocity Member

In the following, description is provided to explain suitable conditions under which the acoustic velocity of the transversal bulk wave of the high acoustic velocity member 20 made of a 4H-type or 6H-type crystal polytype silicon carbide can be made faster than the acoustic velocity of the transversal bulk wave coupling to the longitudinal leaky SAW (LLSAW) propagating through the piezoelectric layer 10. In a multilayer structure including the IDT electrode 110 made of Al, the piezoelectric layer 10 made of LiTaO$_3$, and the high acoustic velocity member 20 made of a 4H-type crystal polytype silicon carbide, a relationship between the crystal orientation (propagation angle ψ in Euler angle notation) of the 4H-type crystal polytype silicon carbide and acoustic velocity has been discovered by a simulation using a finite element solution. Parameters used in the present simulation are depicted in Table 1.

Note that the 4H-type crystal polytype silicon carbide and the 6H-type crystal polytype silicon carbide have the same acoustic characteristics. Therefore, the following suitable conditions discovered in the high acoustic velocity member 20 made of the 4H-type crystal polytype silicon carbide are also applied to the high acoustic velocity member 20 made of the 6H-type crystal polytype silicon carbide.

Figure 4A:
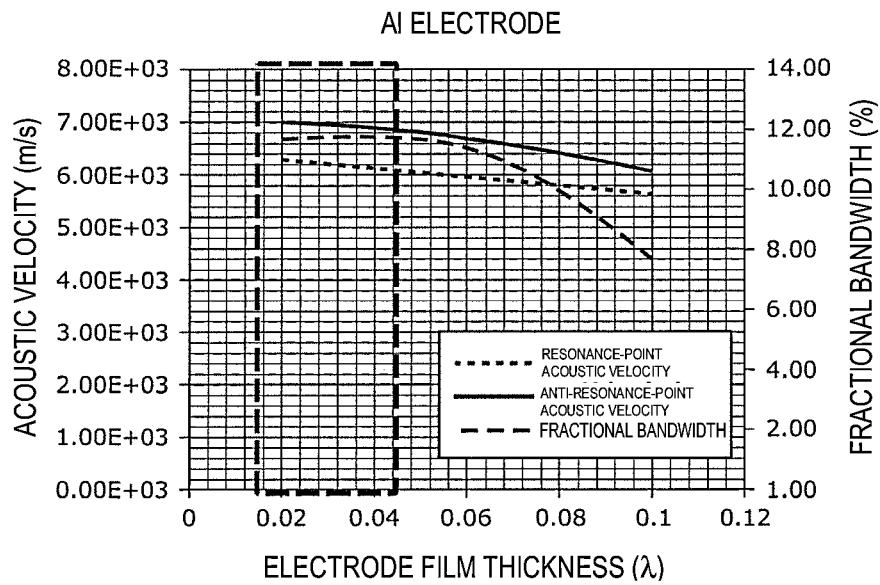
FIG. 4A is a graph showing a relationship between the film thickness of an IDT electrode (Al) and acoustic velocity in a multilayer structure including an LN piezoelectric layer and a high acoustic velocity member.
Figure 4B:
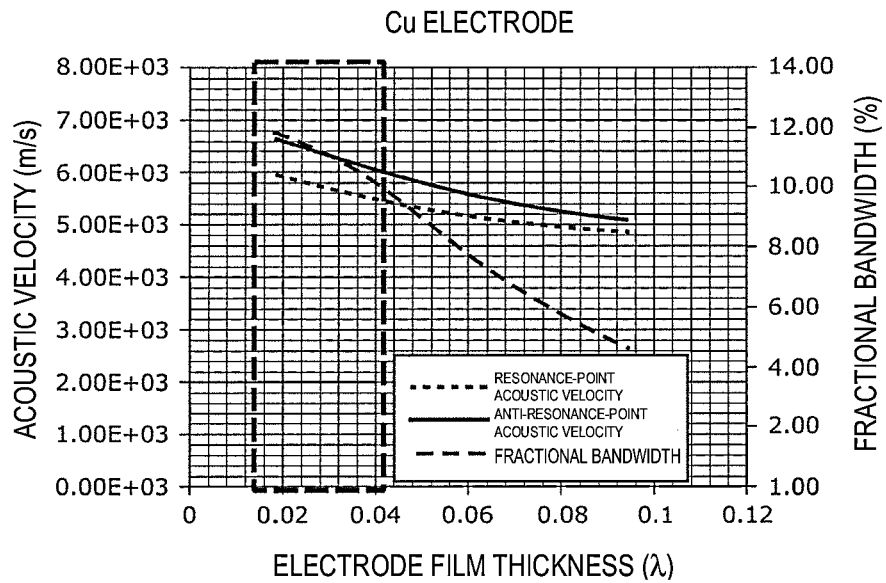
FIG. 4B is a graph showing a relationship between the film thickness of an IDT electrode (Cu) and acoustic velocity in a multilayer structure including an LN piezoelectric layer and a high acoustic velocity member.

FIG. 4A is a graph showing a relationship between the film thickness of an IDT electrode (Al) and acoustic velocity in a multilayer structure including an LN piezoelectric layer and a high acoustic velocity member. Also, FIG. 4B is a graph showing a relationship between the film thickness of an IDT electrode (Cu) and acoustic velocity in a multilayer structure including an LN piezoelectric layer and a high acoustic velocity member. In FIGS. 4A and 4B, acoustic velocity and fractional band width (value obtained by dividing a frequency difference between an anti-resonant frequency and a resonant frequency by the resonant frequency) of an acoustic wave propagating through the IDT electrode and the piezoelectric layer are shown when the film thickness of the IDT electrode is changed.

As shown in FIGS. 4A and 4B, as the film thickness of the IDT electrode is reduced, the acoustic velocity becomes faster and the fractional band width increases (the electromechanical coupling coefficient increases). To support a higher frequency of the acoustic wave device and achieve a wider band, about 10% or more is preferably ensured as a fractional band width of a resonator, and about 6000 m/s to about 7000 m/s is preferably ensured as the acoustic velocity. Also from this, as the high acoustic velocity member 20, the acoustic velocity of the transversal bulk wave on the order of about 7500 m/s or higher is preferably ensured to trap an acoustic wave with an acoustic velocity of about 6000 m/s to about 7000 m/s in the IDT electrode and the piezoelectric layer.

Figure 5A:
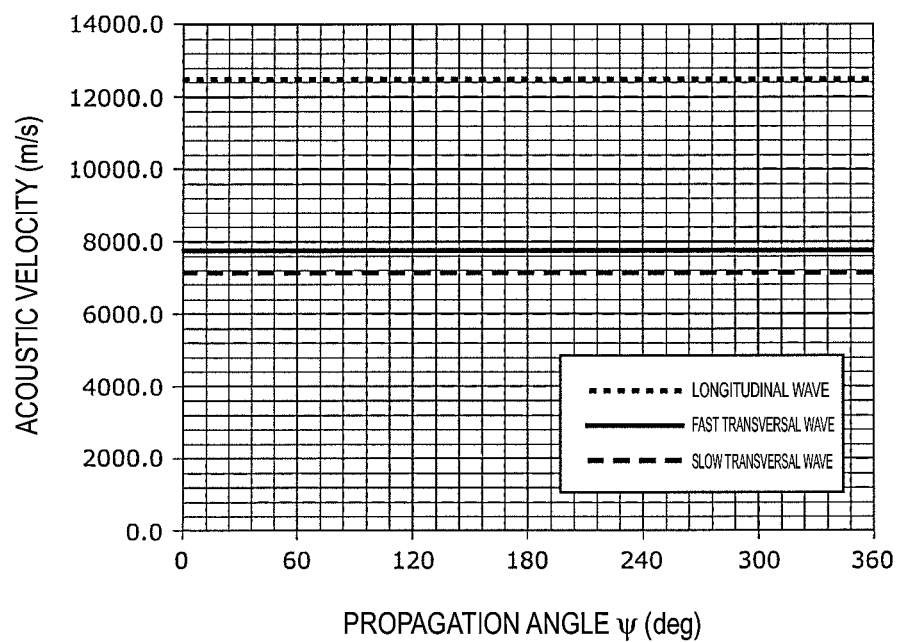
FIG. 5A is a graph showing a relationship between the propagation angle and acoustic velocity in a c-face 4H—SiC high acoustic velocity member.
Figure 5B:
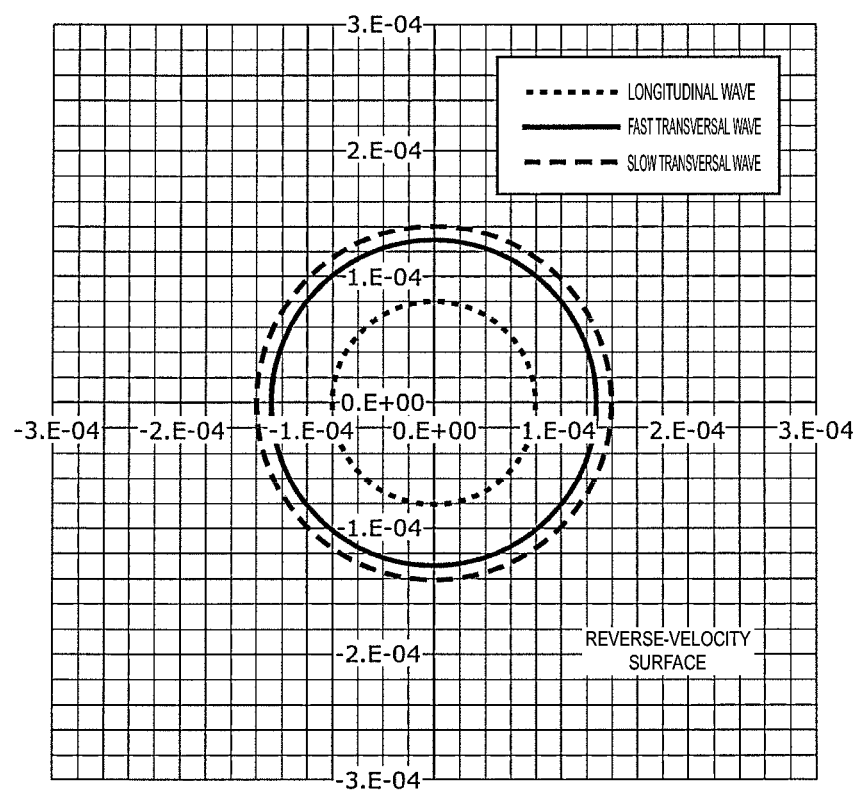
FIG. 5B is a graph showing a reverse-velocity surface in the c-face 4H—SiC high acoustic velocity member.

FIG. 5A is a graph showing a relationship between the propagation angle ψ and acoustic velocity in a c-face 4H—SiC (silicon carbide) high acoustic velocity member. Also, FIG. 5B is a graph showing a reverse-velocity surface in the c-face 4H—SiC high acoustic velocity member. In FIG. 5A, the relationship between the propagation angle ψ and acoustic velocity of a "longitudinal bulk wave", a "fast transversal bulk wave", and a "slow transversal bulk wave" of the high acoustic velocity member 20 having the c face (0, 0, ψ) as a principal surface is shown.

To make the acoustic velocity of the transversal bulk wave of the high acoustic velocity member 20 faster than the acoustic velocity of the transversal bulk wave coupling to the longitudinal leaky SAW (LLSAW) propagating through the piezoelectric layer 10, the acoustic velocity of the "slowest transversal bulk wave" of the high acoustic velocity member 20 is preferably faster than the acoustic velocity of the longitudinal leaky SAW (LLSAW).

Here, since the acoustic velocity of the longitudinal leaky SAW (LLSAW) is about 6000 m/s to about 7500 m/s, the acoustic velocity of the "slow transversal bulk wave" of the high acoustic velocity member 20 is preferably equal to or higher than about 7500 m/s, for example. However, as shown in FIG. 5A, the acoustic velocity of the "slow transversal bulk wave" of the high acoustic velocity member 20 does not become equal to or higher than about 7500 m/s in the entire angle range of the propagation angle ψ.

Thus, when Euler angles of the 4H-type or 6H-type crystal polytype silicon carbide included in the high acoustic velocity member 20 are denoted as (0, 0, ψ), no suitable condition for ψ is provided to widen the band while ensuring more favorable Q characteristics.

Figure 6A:
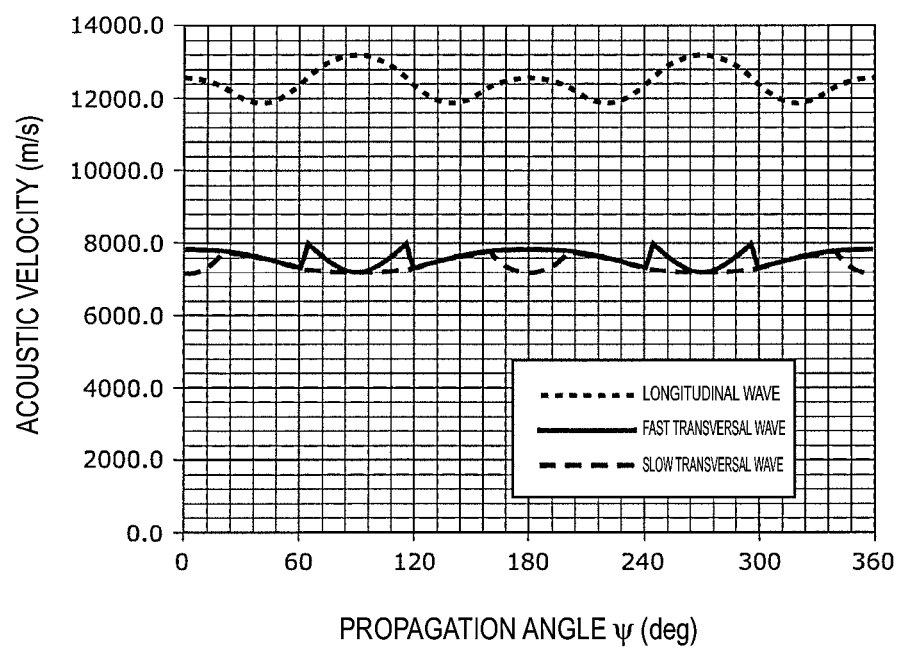
FIG. 6A is a graph showing a relationship between the propagation angle and acoustic velocity in an a-face 4H—SiC high acoustic velocity member.
Figure 6B:
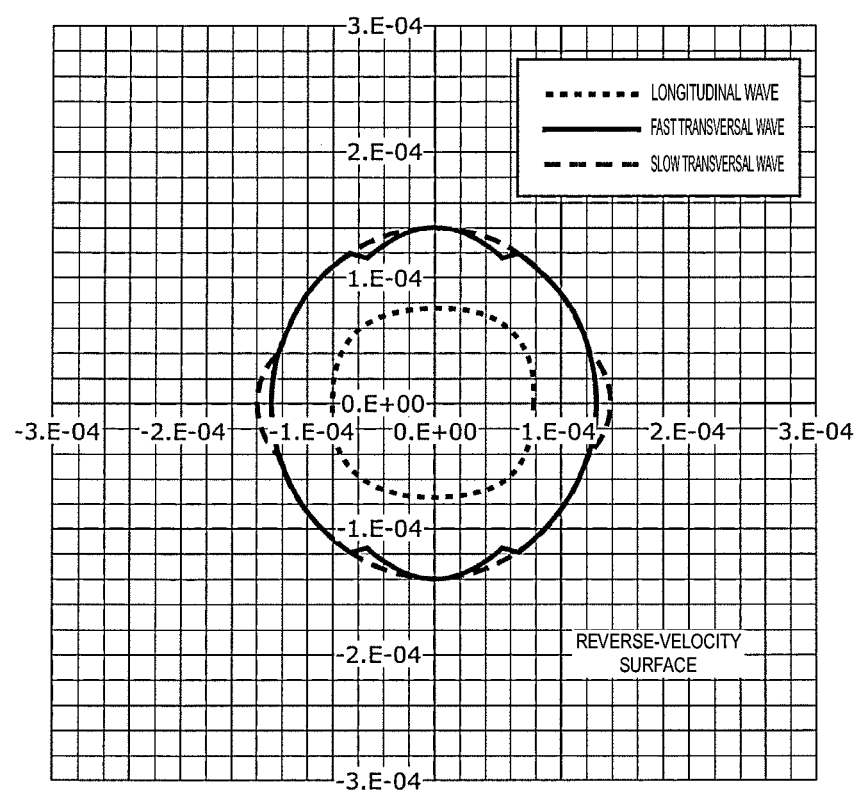
FIG. 6B is a graph showing a reverse-velocity surface in the a-face 4H—SiC high acoustic velocity member.

FIG. 6A is a graph showing a simulation result of a relationship between the propagation angle ψ and acoustic velocity in an a-face 4H—SiC high acoustic velocity member. Also, FIG. 6B is a graph showing a reverse-velocity surface in the a-face 4H—SiC high acoustic velocity member. In FIG. 6A, the relationship between the propagation angle ψ and acoustic velocity of a "longitudinal bulk wave", a "fast transversal bulk wave", and a "slow transversal bulk wave" of the high acoustic velocity member having the a face (90, 90, ψ) as a principal surface is shown.

Here, since the acoustic velocity of the longitudinal leaky SAW (LLSAW) is about 6000 m/s to about 7500 m/s, the acoustic velocity of the "slow transversal bulk wave" of the high acoustic velocity member 20 is desirably set equal to or higher than about 7500 m/s, for example. With this, from FIG. 6A, a suitable range in which the acoustic velocity of the "slow transversal bulk wave" of the high acoustic velocity member 20 is equal to or higher than about 7500 m/s is any of 20°≤ψ≤40°, 140°≤ψ≤160°, 200°≤ψ≤220°, and 320°≤ψ≤340°, for example.

With this, the acoustic velocity of the transversal bulk wave of the high acoustic velocity member 20 can be made equal to or higher than approximately 7500 m/s, thus allowing trapping of the longitudinal leaky SAW with higher velocity (to about 7500 m/s). Thus, a wider-band acoustic wave device can be provided with high accuracy.

Figure 7A:
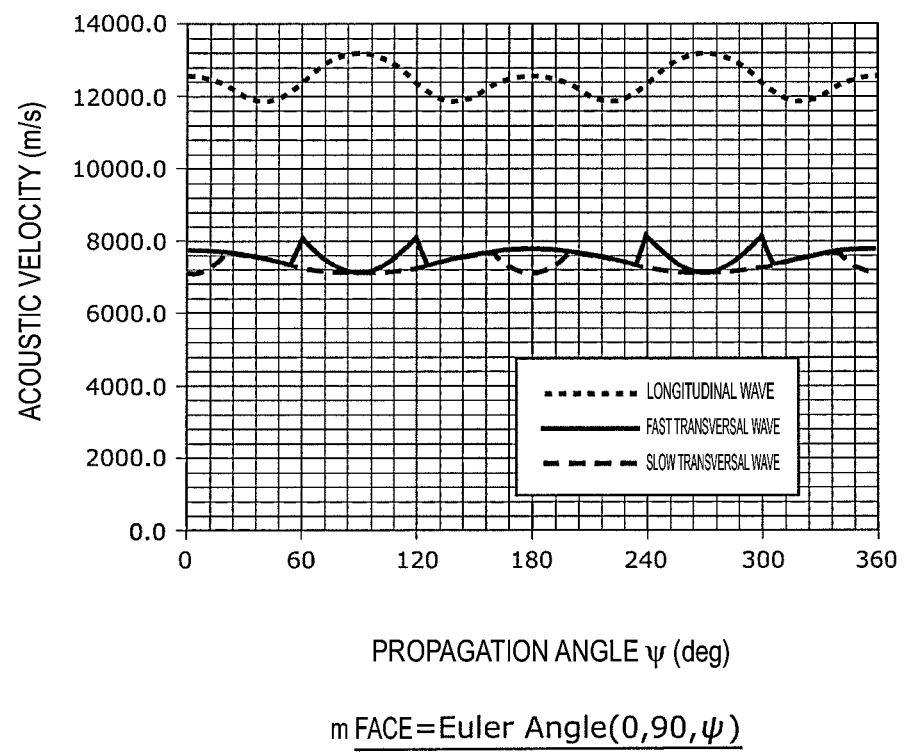
FIG. 7A is a graph showing a relationship between the propagation angle and acoustic velocity in an m-face 4H—SiC high acoustic velocity member.
Figure 7B:
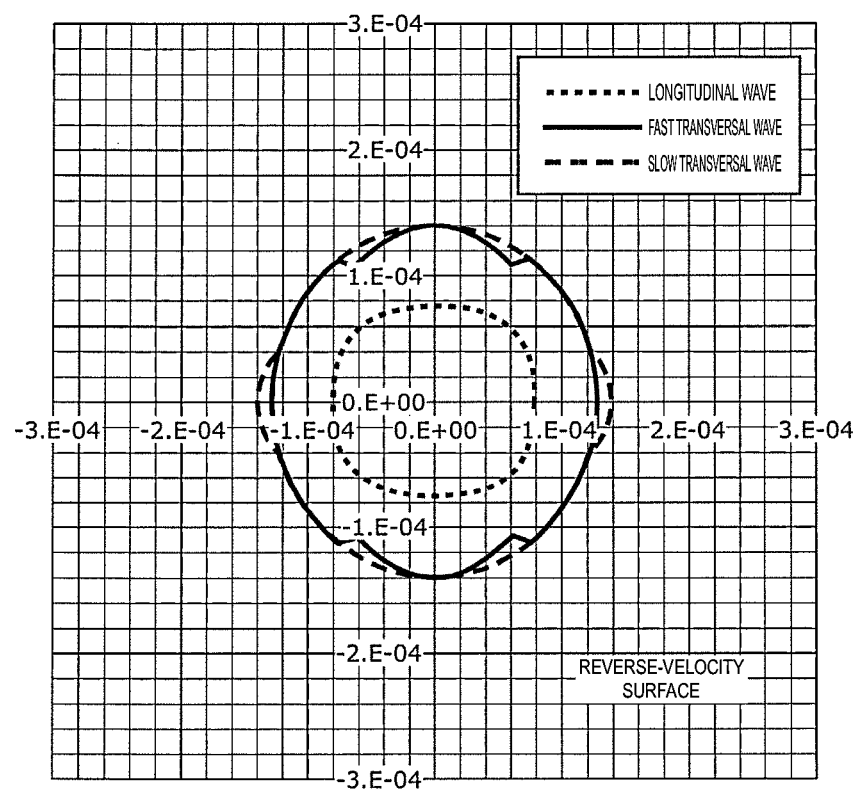
FIG. 7B is a graph showing a reverse-velocity surface in the m-face 4H—SiC high acoustic velocity member.

FIG. 7A is a graph depicting a simulation result of a relation between the propagation angle ψ and acoustic velocity in a multilayer structure including an LT piezoelectric layer and an m-face 4H—SiC high acoustic velocity member. Also, FIG. 7B is a graph showing a simulation result of a reverse-velocity surface in the multilayer structure including the LT piezoelectric layer and the m-face 4H—SiC high acoustic velocity member. In FIG. 7A, the relationship between the propagation angle ψ and acoustic velocity of a "longitudinal bulk wave", a "fast transversal bulk wave", and a "slow transversal bulk wave" of the high acoustic velocity member 20 having the m face (0, 90, ψ) as a principal surface is shown, the relationship being determined by the above-described finite element solution simulation.

Here, since the acoustic velocity of the longitudinal leaky SAW (LLSAW) is about 6000 m/s to about 7500 m/s, the acoustic velocity of the "slow transversal bulk wave" of the high acoustic velocity member 20 is preferably set equal or higher than about 7500 m/s, for example. With this, from FIG. 7A, a suitable range in which the acoustic velocity of the "slow transversal bulk wave" of the high acoustic velocity member 20 is equal to or higher than about 7500 m/s is any of 20°≤ψ≤40°, 140°≤ψ≤160°, 200°≤ψ≤220°, and 320°≤ψ≤340°, for example.

With this, the acoustic velocity of the transversal bulk wave of the high acoustic velocity member 20 can be made equal to or higher than approximately 7500 m/s, thus allowing trapping of the longitudinal leaky SAW with higher velocity (to about 7500 m/s), for example. Thus, a wider-band acoustic wave device can be provided with high accuracy.

Figure 8A:
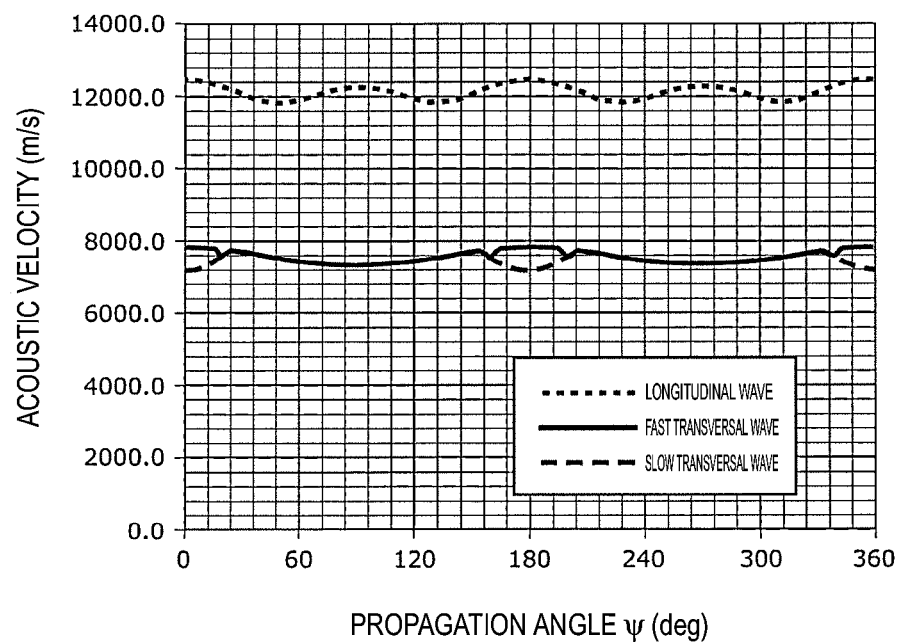
FIG. 8A is a graph showing a relationship between the propagation angle and acoustic velocity in an r-face 4H—SiC high acoustic velocity member.
Figure 8B:
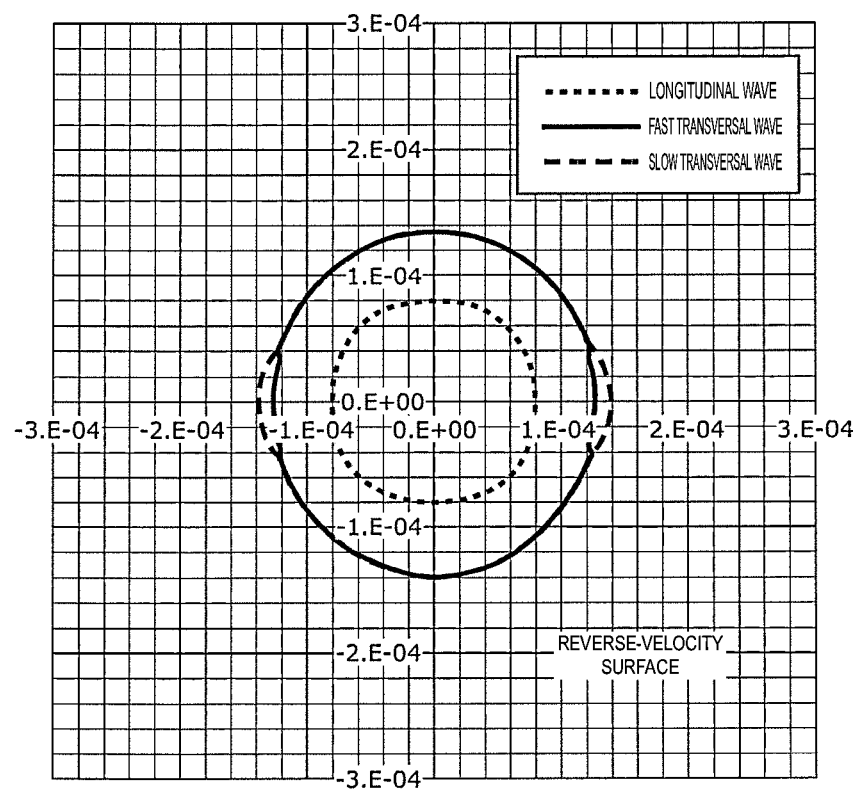
FIG. 8B is a graph showing a reverse-velocity surface in the r-face 4H—SiC high acoustic velocity member.

FIG. 8A is a graph showing a simulation result of a relationship between the propagation angle ψ and acoustic velocity in a multilayer structure including an LT piezoelectric layer and an r-face 4H—SiC high acoustic velocity member. Also, FIG. 8B is a graph showing a simulation result of a reverse-velocity surface in the multilayer structure including the LT piezoelectric layer and the r-face 4H—SiC high acoustic velocity member. In FIG. 8A, the relationship between the propagation angle ψ and acoustic velocity of a "longitudinal bulk wave", a "fast transversal bulk wave" is shown, and a "slow transversal bulk wave" of the high acoustic velocity member 20 having the r face (0, about 122.23, ψ) as a principal surface, the relationship being determined by the above-described finite element solution simulation.

Here, since the acoustic velocity of the longitudinal leaky SAW (LLSAW) is about 6000 m/s to about 7500 m/s, the acoustic velocity of the "slow transversal bulk wave" of the high acoustic velocity member 20 is preferably set equal or higher than about 7500 m/s, for example. With this, from FIG. 8A, a suitable range in which the acoustic velocity of the "slow transversal bulk wave" of the high acoustic velocity member 20 is equal to or higher than about 7500 m/s is any of 20°≤ψ≤50°, 130°≤ψ≤160°, 200°≤ψ≤230°, and 310°≤ψ≤340°, for example.

With this, the acoustic velocity of the transversal bulk wave of the high acoustic velocity member 20 can be made equal to or higher than approximately 7500 m/s, thus allowing trapping of the longitudinal leaky SAW with higher velocity (to about 7500 m/s). Thus, a wider-band acoustic wave device can be provided with high accuracy.

1-3. Resonance Characteristics of Acoustic Wave Device

TABLE 1

| Component | LLSAW mode |
| --- | --- |
| IDT electrode 110 | Al |
| | Film thickness: IDT wavelength λ × about 0.03 |
| Piezoelectric layer 10 | LiTaO$_3$ (90°, 90°, 31°) |
| | Film thickness: IDT wavelength λ × about 0.2 |
| High acoustic velocity member 20 | 4H-type crystal polytype silicon carbide |
| | (c face, a face, m face, r face) |

Figure 9A:
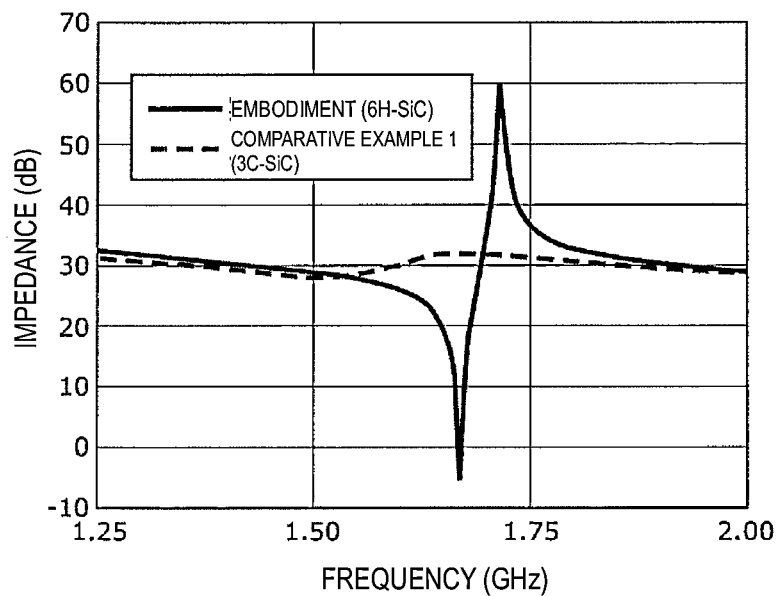
FIG. 9A is a graph in which a comparison is made in impedance characteristics between a multilayer structure including an LT piezoelectric layer and a SiC member according to a preferred embodiment and one according to Comparative Example 1.
Figure 9B:
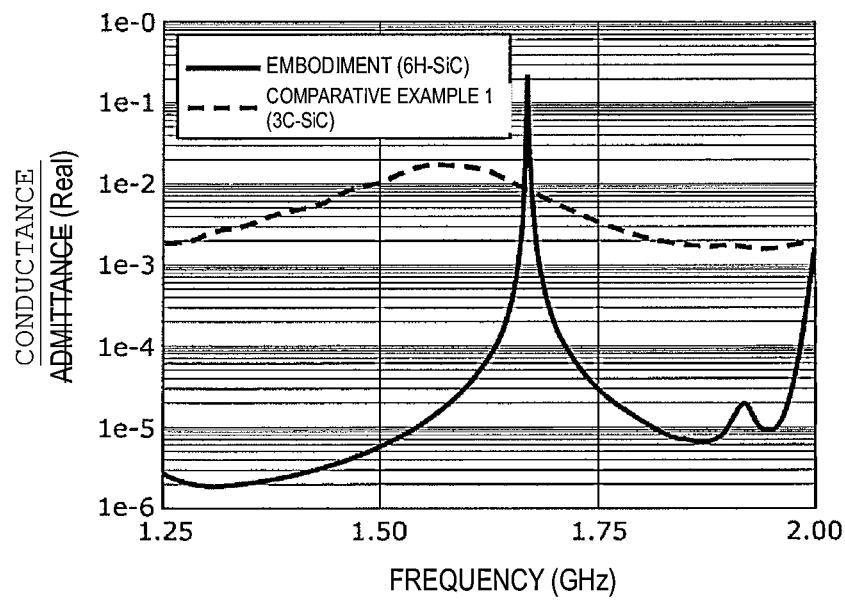
FIG. 9B is a graph in which a comparison is made in conductance characteristics between the multilayer structure including the LT piezoelectric layer and the SiC member according to a preferred embodiment of the present invention and one according to Comparative Example 1.

FIG. 9A is a graph in which a comparison is made in impedance characteristics between a multilayer structure including an LT piezoelectric layer, and a SiC high acoustic velocity member according to the present preferred embodiment and one according to Comparative Example 1. FIG. 9B is a graph in which a comparison is made in conductance characteristics between the multilayer structure including the LT piezoelectric layer, and the SiC high acoustic velocity member according to the present preferred embodiment and one according to Comparative Example 1. In FIGS. 9A and 9B, results of impedance characteristics and conductance characteristics of the acoustic wave devices according to the present preferred embodiment and Comparative Example 1 determined by a finite element solution simulation are shown.

Here, the acoustic wave device according to the present preferred embodiment has a multilayer structure and parameters depicted in Table 1. As the high acoustic velocity member 20, a 4H-type crystal polytype silicon carbide is used. On the other hand, in the acoustic wave device according to Comparative Example 1, the IDT electrode and the piezoelectric layer each have a structure similar to that of the acoustic wave device according to the present preferred embodiment, while a 3C-type silicon carbide is used as the high acoustic velocity member.

In the acoustic wave device according to the present preferred embodiment, it is discovered that trapping of the longitudinal leaky SAW (LLSAW) in the piezoelectric layer 10 and the IDT electrode 110 is maintained and, as depicted in FIG. 9A, impedance characteristics with a resonance point and an anti-resonance point each with a large Q factor have been obtained. Also, as shown in FIG. 9B, in the acoustic wave device according to the present preferred embodiment, it is discovered that favorable conductance characteristics have been obtained.

On the other hand, in the acoustic wave device according to Comparative Example 1, as shown in FIGS. 9A and 9B, no steep peak appears in the impedance characteristics and the conductance characteristics and trapping of the longitudinal leaky SAW (LLSAW) in the piezoelectric layer and the IDT electrode is insufficient. Thus, it is determined that the longitudinal leaky SAW (LLSAW) is leaked to the high acoustic velocity member 20.

That is, as can be seen from the comparison among the reverse-velocity surfaces in FIG. 2A, the 4H-type and 6H-type crystal polytype silicon carbides having a transversal bulk wave acoustic velocity equal to or higher than about 7000 m/s can sufficiently trap the longitudinal leaky SAW (LLSAW). By contrast, the 3C-type has a transversal bulk wave acoustic velocity of about 4000 m/s, and is not sufficient to trap the mode. That is, it can be determined that, even among the same silicon carbides, one that can obtain a favorable Q factor in the longitudinal leaky SAW (LLSAW) mode is the 4H-type or 6H-type crystal polytype silicon carbide when used as the high acoustic velocity member 20.

Figure 10:
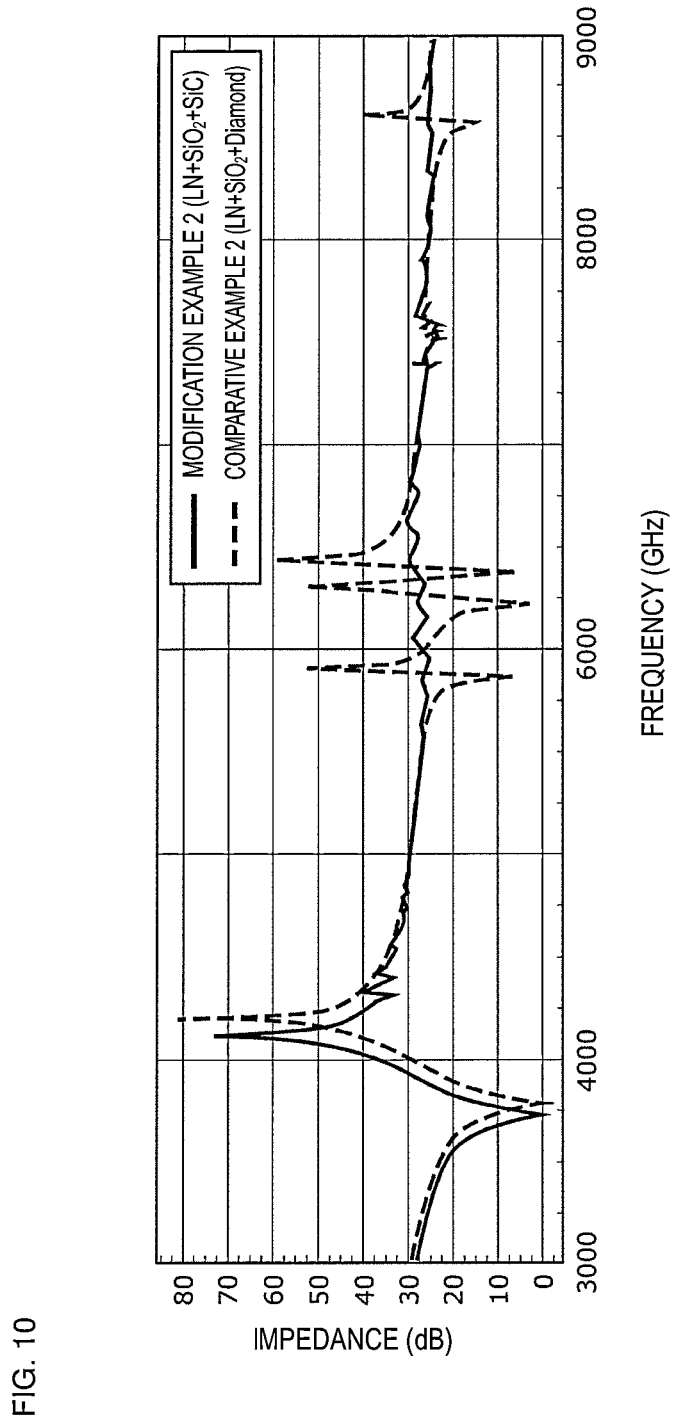
FIG. 10 is a graph in which a comparison is made in impedance characteristics between a multilayer structure including an LN piezoelectric layer, an intermediate layer, and a high acoustic velocity member according to Modified Example 2 and one according to Comparative Example 2.

FIG. 10 is a graph in which a comparison is made in impedance characteristics between a multilayer structure including a piezoelectric layer, an intermediate layer, and a high acoustic velocity member according to Modified Example 2 and one according to Comparative Example 2. In FIG. 10, results of impedance characteristics of the acoustic wave devices according to Modified Example 2 and Comparative Example 2 are shown found by a finite element solution simulation.

Here, the acoustic wave device 1B according to Modified Example 2 has a multilayer structure shown in FIG. 3B. However, the functional layer 31 is not included. On the other hand, in the acoustic wave device according to Comparative Example 2, as for the IDT electrode, the piezoelectric layer, and the intermediate layer, the structure is similar to that of the acoustic wave device 1B according to Modified Example 2. However, the material structure of the high acoustic velocity layer is different. Parameters of the acoustic wave devices according to Modified Example 2 and Comparative Example 2 used in this simulation are shown in Table 2.

TABLE 2

| | LLSAW mode |
| --- | --- |
| Modified Example 2 | |
| IDT electrode 110 | Al |
| | Film thickness: IDT wavelength λ × about 0.04 |
| Piezoelectric layer 10 | LiNbO$_3$ (90°, 90°, 40°) |
| | Film thickness: IDT wavelength λ × about 0.2 |
| Intermediate layer | SiO$_2$ |

TABLE 2-continued

| | LLSAW mode |
|---|---|
| 32 | Film thickness: IDT wavelength λ × about 0.05 |
| High acoustic velocity member 20 Comparative Example 2 | 4H-type crystal polytype silicon carbide (c face) |
| IDT electrode | Al Film thickness: IDT wavelength λ × about 0.04 |
| Piezoelectric layer | LiNbO$_3$ (90°, 90°, 40°) Film thickness: IDT wavelength λ × about 0.2 |
| Intermediate layer | SiO$_2$ Film thickness: IDT wavelength λ × about 0.05 |
| High acoustic velocity member | Diamond (0°, 0°, 0°) |

As shown in Table 2, in the acoustic wave device 1B according to Modified Example 2, the material of the IDT electrode 110 is Al, the material of the piezoelectric layer 10 is LiNbO$_3$ (Euler angle notation (90°, 90°, 40°)), the material of the high acoustic velocity member 20 is a 4H-type crystal polytype silicon carbide (Euler angle notation (0°, 0°, 0°)), and the material of the intermediate layer 32 is SiO$_2$.

On the other hand, in the acoustic wave device according to the comparative example, the materials of the IDT electrode, the piezoelectric layer, and the intermediate layer are similar to those in Modified Example 2, and the material of the high acoustic velocity member is diamond (Euler angle notation (0°, 0°, 0°)).

As evident from the impedance characteristics in FIG. 10, in the acoustic wave device according to Comparative Example 2 using diamond with extremely fast acoustic velocity (transversal bulk wave acoustic velocity: about 10000 m/s or higher) as the high acoustic velocity member, a minimum point (resonance point) and a maximum point (anti-resonance point) of impedance can be seen near 4 GHz, and it can be discovered that the LLSAW mode is trapped in the IDT electrode, the piezoelectric layer, and the intermediate layer. However, at the same time, the spurious mode having an acoustic velocity higher than the longitudinal bulk wave acoustic velocity of the longitudinal leaky SAW (LL-SAW) is also trapped in the IDT electrode, the piezoelectric layer, and the intermediate layer, and thus many spurious modes occur in a band on a high frequency side from about 5 GHz.

By contrast, in the acoustic wave device 1B according to Modified Example 2, the transversal bulk wave acoustic velocity of the 4H-type crystal polytype silicon carbide is relatively near the longitudinal leaky SAW (LLSAW). Thus, the spurious mode is leaked to the high acoustic velocity member 20 and a large spurious mode does not remain. That is, in the acoustic wave device 1B according to Modified Example 2, it is possible to reduce spurious modes by the high acoustic velocity member 20 made of the 4H-type crystal polytype silicon carbide.

The transversal bulk wave acoustic velocity of diamond is extremely fast (equal to or higher than about 10000 m/s). This bulk wave with high acoustic velocity is preferable in view of viscosity losses but, on the other hand, induces the occurrence of spurious modes outside the band. This is because a high-order plate wave mode, which has an acoustic velocity higher than that of the longitudinal leaky SAW (LLSAW), is simultaneously trapped by diamond which is the high acoustic velocity member. In contrast, the transversal bulk wave acoustic velocity of the 4H-type or 6H-type crystal polytype silicon carbide is faster by approximately 10% than that of the longitudinal leaky SAW (LLSAW), and is slower than a spurious mode as described above. Thus, it is possible to leak the spurious mode to the high acoustic velocity member and reduce the occurrence of spurious modes.

Figure 11A:
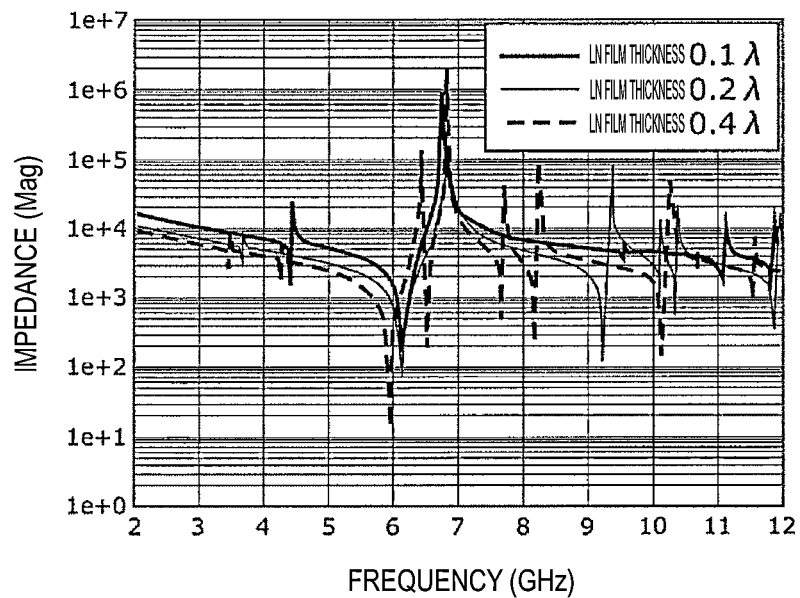
FIG. 11A is a graph showing changes in impedance characteristics when the film thickness of a piezoelectric layer in a multilayer structure including an LN piezoelectric layer and a high acoustic velocity member is changed.

FIG. 11A is a graph showing changes in impedance characteristics when the film thickness of a piezoelectric layer in a multilayer structure including an LN piezoelectric layer, and a high acoustic velocity member is changed. In FIG. 11A, impedance (resonance) characteristics when the film thickness of a piezoelectric layer made of LiNbO$_3$ is changed are shown. As shown in FIG. 11A, it can be discovered that as the film thickness of the piezoelectric layer is increased, the spurious mode becomes closer to a basic mode.

Figure 11B:
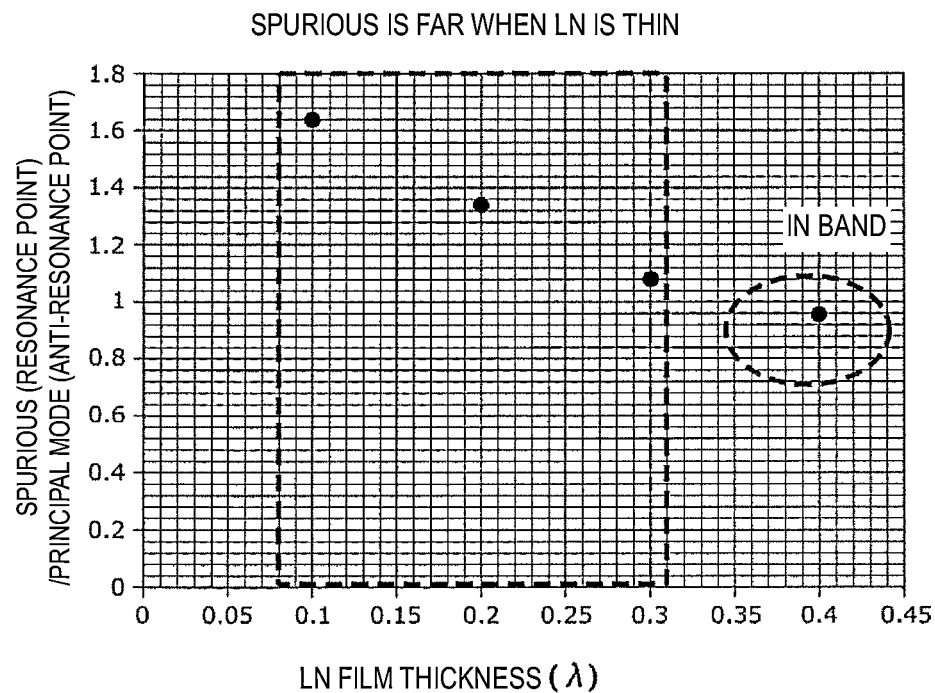
FIG. 11B is a graph showing a relationship between the film thickness of the piezoelectric layer in the multilayer structure including the LN piezoelectric layer and the high acoustic velocity member, and spurious occurrence frequency.

FIG. 11B is a graph showing a relationship between the film thickness of the piezoelectric layer in the multilayer structure including the LN piezoelectric layer, and the high acoustic velocity member, and spurious mode occurrence frequency. As shown in FIG. 11B, as the film thickness of the piezoelectric layer is increased, spurious mode (resonant frequency)/basic mode (anti-resonant frequency) becomes smaller. In other words, as the film thickness of the piezoelectric layer is increased, a gap between the occurrence frequency of the spurious mode and the occurrence frequency of the basic mode is decreased. When the film thickness of the piezoelectric layer is increased, in the long run, a spurious mode enters the pass band of the acoustic wave device, thus deteriorating bandpass characteristics.

With this, as spurious mode (resonant frequency)/basic mode (anti-resonant frequency) to prevent spurious modes from entering the pass band of the acoustic wave device, approximately 1.2 or more is preferably ensured. When the acoustic velocity of the principal mode of the longitudinal leaky SAW (LLSAW) is set at approximately 6500 m/s to 6700 m/s, a spurious mode having an acoustic velocity equal to or higher than approximately 8000 m/s (acoustic velocity of the principal mode of LLSAW×1.2), for example, is to be leaked. Thus, the transversal bulk wave acoustic velocity of the high acoustic velocity member 20 as a support substrate is preferably equal to or lower than about 8000 m/s, for example.

With this, for example, a high-order plate wave mode having a velocity higher than about 8000 m/s and causing an unwanted spurious mode to occur is leaked. Thus, it is possible to selectively trap a specific longitudinal leaky SAW. Therefore, an acoustic wave device with excellent Q characteristics and with reduced spurious modes can be provided. This means that the acoustic wave devices 1, 1A, and 1B according to the present preferred embodiment can have features of a small size, low loss, and high selectivity in configuring a high-frequency filter, multiplexer, and RF front-end circuit even in a high-frequency band equal to or higher than about 3 GHz.

OTHER PREFERRED EMBODIMENTS

While the acoustic wave devices according to preferred embodiments of the present invention have been described in the foregoing, the present invention is not limited to the above-described preferred embodiments. The present invention also includes other preferred embodiments achieved by combining any of the components or features of the above-described preferred embodiments, a modified example obtained by making various modifications conceived by a person skilled in the art to the above-described preferred embodiments in a range not deviating from the gist of the present invention, and various devices having incorporated therein an acoustic wave device according to a preferred embodiment of the present invention.

Note that while an X cut is exemplarily described as the cut angle of the piezoelectric layer emphatically exciting the longitudinal leaky SAW (LLSAW) mode in the above-described preferred embodiment, this is not restrictive. Also, it is evident that the same is true for the leaky surface acoustic wave (LSAW) mode.

Preferred embodiments of the present invention are widely used for various electronic devices and communication devices. Examples of electronic devices include high-frequency filters, multiplexers, and RF frontend components.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
a piezoelectric layer including a first principal surface and a second principal surface opposite to each other;
an IDT electrode directly or indirectly on the first principal surface; and
a high acoustic velocity member directly or indirectly on the second principal surface and including a 4H-type or 6H-type crystal polytype silicon carbide; wherein
the high acoustic velocity member includes:
a support substrate supporting the piezoelectric layer; and
a high acoustic velocity layer between the support substrate and the piezoelectric layer;
the high acoustic velocity layer is made of the 4H-type or 6H-type crystal polytype silicon carbide; and
the high acoustic velocity layer has a transversal bulk wave acoustic velocity faster than a transversal bulk wave acoustic velocity of the piezoelectric layer.

2. The acoustic wave device according to claim 1, wherein the high acoustic velocity member has a transversal bulk wave acoustic velocity faster than an acoustic velocity of a principal mode propagating through the piezoelectric layer.

3. The acoustic wave device according to claim 1, wherein the support substrate is made of at least one of silicon, sapphire, and silicon carbide.

4. The acoustic wave device according to claim 1, wherein the piezoelectric layer has a film thickness equal to or smaller than about three times an IDT wavelength defined by two times a pitch between a plurality of electrode fingers of the IDT electrode.

5. The acoustic wave device according to claim 4, wherein the film thickness of the piezoelectric layer is equal to or larger than about 0.05 times the IDT wavelength and equal to or smaller than about 0.5 times the IDT wavelength.

6. The acoustic wave device according to claim 1, wherein a transversal bulk wave acoustic velocity of the high acoustic velocity member is equal to or higher than about 7500 m/s.

7. The acoustic wave device according to claim 1, wherein the 4H-type or 6H-type crystal polytype silicon carbide included in the high acoustic velocity member has Euler angles which (1) are denoted as (0, 90, ψ) and (2) are any of 20°≤ψ≤40°, 140°≤ψ≤160°, 200°≤ψ≤220°, and 320°≤ψ≤340°.

8. The acoustic wave device according to claim 1, wherein the 4H-type or 6H-type crystal polytype silicon carbide included in the high acoustic velocity member has Euler angles which (1) are denoted as (0, 122.23, ψ) and (2) are any of 20°≤ψ≤50°, 130°≤ψ≤160°, 200°≤ψ≤230°, and 310°≤ψ≤340°.

9. The acoustic wave device according to claim 1, wherein a transversal bulk wave acoustic velocity of the high acoustic velocity member is equal to or lower than about 8000 m/s.

10. The acoustic wave device according to claim 1, wherein the piezoelectric layer is made of lithium tantalate.

11. The acoustic wave device according to claim 1, wherein the piezoelectric layer is made of lithium niobate.

12. The acoustic wave device according to claim 11, wherein, when Euler angles of the piezoelectric layer are denoted as (φ, θ, ψ), −5°≤φ≤5° and 0°≤θ≤90° and 85°≤ψ≤95°.

13. The acoustic wave device according to claim 11, wherein, when Euler angles of the piezoelectric layer are denoted as (φ, θ, ψ), 15°≤φ≤95° and 85°≤θ≤95° and 0°≤ψ≤60°.

14. The acoustic wave device according to claim 11, wherein, when Euler angles of the piezoelectric layer are denoted as (φ, θ, ψ), −5°≤φ≤5° and 120°≤θ≤160° and −5°≤ψ≤5°.

15. The acoustic wave device according to claim 1, further comprising a functional layer provided on the first principal surface of the piezoelectric layer and covering the IDT electrode.

16. An acoustic wave device comprising:
a piezoelectric layer including a first principal surface and a second principal surface opposite to each other;
an IDT electrode directly or indirectly on the first principal surface; and
a high acoustic velocity member directly or indirectly on the second principal surface and including a 4H-type or 6H-type crystal polytype silicon carbide; wherein
the 4H-type or 6H-type crystal polytype silicon carbide included in the high acoustic velocity member has Euler angles which (1) are denoted as (90, 90, ψ) and (2) are any of 20°≤ψ≤40°, 140°≤ψ≤160°, 200°≤ψ≤220°, and 320°≤ψ≤340°.

17. The acoustic wave device according to claim 16, wherein
the high acoustic velocity member is a support substrate supporting the piezoelectric layer; and
the support substrate is made of a 4H-type or 6H-type crystal polytype silicon carbide.

18. An acoustic wave device comprising:
a piezoelectric layer including a first principal surface and a second principal surface opposite to each other;
an IDT electrode directly or indirectly on the first principal surface;
a high acoustic velocity member directly or indirectly on the second principal surface and including a 4H-type or 6H-type crystal polytype silicon carbide; and
an intermediate layer between the piezoelectric layer and the high acoustic velocity member; wherein
an acoustic velocity of a transversal bulk wave slowest among transversal bulk waves propagating through the intermediate layer is slower than an acoustic velocity of a principal mode propagating through the piezoelectric layer.

19. The acoustic wave device according to claim 18, wherein the intermediate layer includes silicon dioxide as a main component.

* * * * *